United States Patent [19]

Sonntag et al.

[11] Patent Number: 4,818,929
[45] Date of Patent: Apr. 4, 1989

[54] FULLY DIFFERENTIAL ANALOG COMPARATOR

[75] Inventors: Jeffrey L. Sonntag, Muhlenberg Township, Berks County; Thayamkulangara R. Viswanathan, Borough of Wyomissing Hills, Berks County; William B. Wilson, Cumru Township, Berks County, all of Pa.

[73] Assignee: American Telephone and Telegraph Company, AT&T Bell Laboratories, Murray Hill, N.J.

[21] Appl. No.: 214,561

[22] Filed: Jul. 1, 1988

[51] Int. Cl.⁴ .................................................. G05F 3/24
[52] U.S. Cl. ..................................... 323/316; 330/257; 330/288
[58] Field of Search ............... 323/311, 312, 313, 314, 323/315, 316; 330/252, 253, 254, 257, 277, 278, 288

[56] References Cited

U.S. PATENT DOCUMENTS

| | | | |
|---|---|---|---|
| 4,333,058 | 6/1982 | Hoover | 330/257 |
| 4,477,782 | 10/1984 | Swanson | 330/288 |
| 4,513,252 | 4/1985 | Sano | 323/316 |
| 4,554,515 | 11/1985 | Burson et al. | 330/257 |
| 4,618,815 | 10/1986 | Swanson | 323/315 |
| 4,779,059 | 10/1988 | Taki et al. | 323/316 |

Primary Examiner—Peter S. Wong
Attorney, Agent, or Firm—Scott W. McLellan

[57] ABSTRACT

A novel fully differential analog comparator having cascaded gain stages powered by two buses. The two buses are powered by a current source and a variable gain current mirror responsive to the current source. The current source and the current mirror isolate the buses from external power and ground to achieve high power supply noise immunity. True and complementary outputs of the comparator are provided having an adjustable output common mode voltage to optimize the driving of subsequent logic gates responsive to the comparator.

27 Claims, 3 Drawing Sheets

FULLY DIFFERENTIAL ANALOG COMPARATOR

CROSS-REFERENCE TO RELATED APPLICATION

This application is a companion application of Ser. No. 267,957, having a common assignee and filed simultaneously herewith, titled "Analog Comparator", by J. P. Hein and T. R. Viswanathan.

BACKGROUND OF THE INVENTION

1. Field of the Invention

This invention relates to an integrated circuit technique for producing an accurate high-speed analog comparator with low power consumption.

2. Description of the Prior Art

An analog comparator is a basic functional unit utilized in analog circuit design, as, for example, in analog-to-digital converters (ADCs). The relative performance of analog comparators is measured by their specifications, such as input offset voltage, offset current, propagation delay, skew, power consumption, etc. In some applications, the input offset voltage and offset current specification can be relaxed (traded off) when other performance criteria are critical. For example, in optical and digital data receivers or in high speed medium resolution ADCs having embedded analog comparators, e.g., those used in video applications (eight or nine bit resolution with ten megahertz conversion rates), low propagation delay through the analog comparators is the most important criteria. Alternatively, in low speed medium resolution ADCs having embedded analog comparators, e.g., ADCs used in telephone (voice) applications where many thousands thereof are employed in channel banks and line cards of switching systems (eight to twelve bits resolution, eight kilohertz conversion rates), the power consumption of the analog comparators is of primary importance. Hence, it is desirable to have a single analog comparator design easily adaptable for any application.

SUMMARY OF THE INVENTION

We have invented a fully differential analog comparator having substantially identical propagation delay from either one of two inputs. The comparator has very low sensitivity to power supply noise and the gain of the comparator can be scaled as needed. Additionally, the comparator can be adapted such that the average differential output voltage (output common mode voltage) can be adjusted for optimally driving subsequent amplifier stages, such as digital inverters. Further, the average differential input voltage (input common mode voltage) can be compensated for to provide precise control of the output common mode voltage with varying input common mode voltage These and other advantages are obtained generally by having a first and second plurality of cascaded gain stages powered by first and second buses, input to the first plurality of cascaded gain stages coupling to a first voltage input to the comparator and input to the second plurality of cascaded gain stages coupling to a second voltage input to the comparator; a first current source coupling to the first bus; a second current source coupling to the second bus and providing substantially the same current as the first current source; and at least one digital inverter responsive to at least one of the outputs of the first and second plurality of cascaded gain stages. Each of the cascaded gain stages comprises two transistors of differing polarity, each transistor having two output terminals and an input terminal, the input terminals of the two transistors coupling together to form the input to the gain stage, two corresponding output terminals from the two transistors coupling together to form the output of the gain stage, and the remaining output terminals of the two transistors from the corresponding first and second power terminals of the gain stage.

The output common mode voltage is adjusted to a predetermined voltage by adapting the second current source to be a current mirror. The current mirror is a unity gain current mirror, further adapted to vary its gain in response to a predetermined voltage and the output common mode voltage from the output of the first and second plurality of gain stages. This arrangement forces the output common mode voltage to approximate that of the predetermined voltage.

Further, to compensate for the input common mode voltage forcing the output common mode voltage to deviate from the predetermined voltage, a third transistor network is disposed between the first current source and the current mirror. The third transistor network is responsive to either another predetermined voltage source, having a voltage substantially that of the input common mode voltage, or to the first and second input voltages of the comparator.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
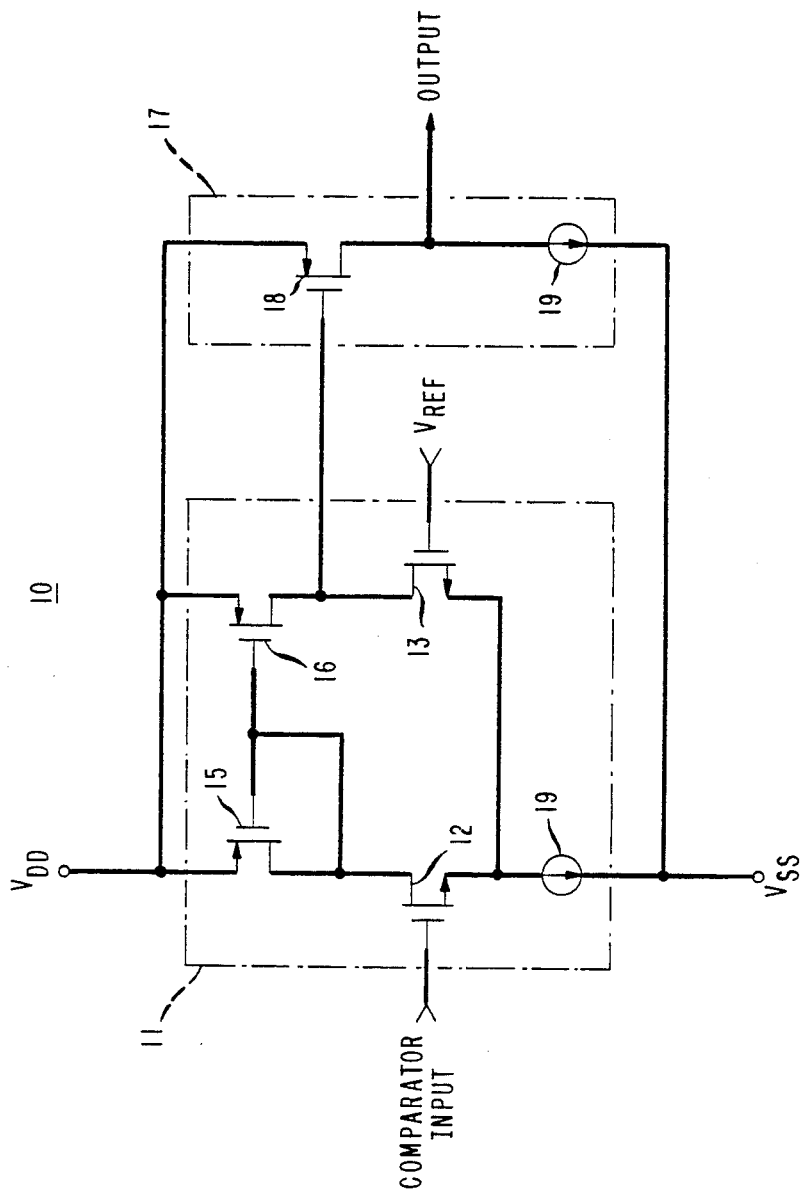
FIG. 1 is an analog comparator of the prior art.

In FIG. 1, a schematic of analog comparator 10 is shown as known in the prior art. A differential input stage 11 is formed by a differential input amplifier having field-effect transistors (FETs) 12, 13 and current source 14 driving a conventional current mirror of FETs 15, 16. The output of stage 11 drives an amplifier 17 formed by FET 18 and current source 19 as a load for FET 18. Output of the comparator 10 is taken from the amplifier 17. This design suffers from a propagation delay skew, i.e., the propagation delay from the comparator input going from greater than the voltage reference input $V_{ref}$ to less than $V_{ref}$ is different from going from less than $V_{ref}$ to greater than $V_{ref}$. For the most part, this propagating delay skew is a result of the asymmetric design of the differential input stage 11. The most notable asymmetry being the path from the comparator input through FET 12, through the current mirror of FETs 15, 16 to amplifier 17. In contrast, the path from $V_{ref}$ to the amplifier 17 is only through FET 13. Overall propagation delay through the comparator 10 is high due to the number of FETs a signal propagates through to reach the output of comparator 10 from the comparator input. Further, this structure suffers from poor noise immunity from the $V_{DD}$ power supply. Still further, the overall gain of the comparator 10 will be limited when short-channel FETs are used. Short channel FETs suffer from reduced gain due to increased output conductance, which increases the loading of all nodes in the stage 11 and in the amplifier 17, reducing the overall gain.

Figure 2:
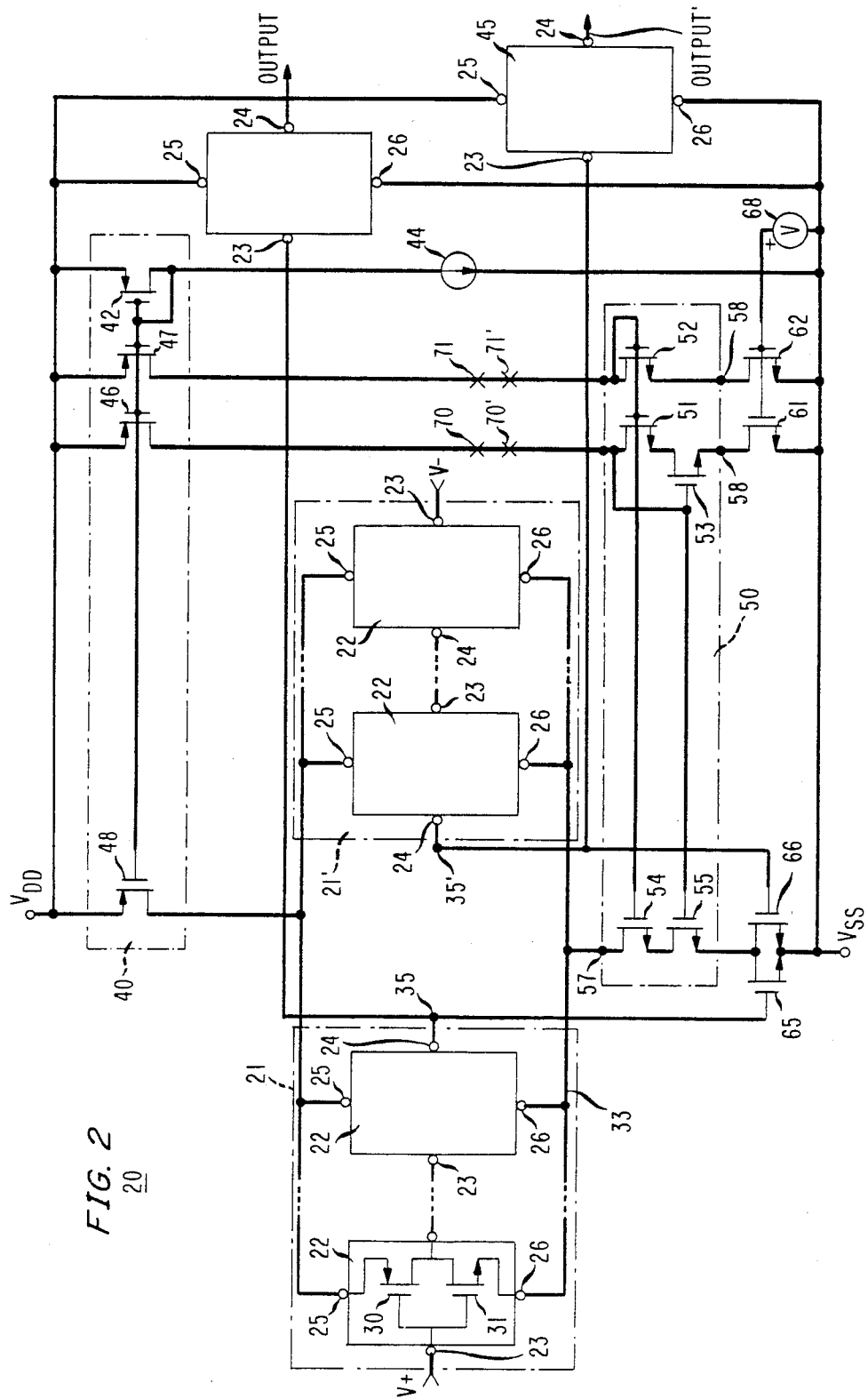
FIG. 2 is a schematic of the analog comparator according to the invention.

A novel, fully-differential analog comparator 20 is shown schematically in FIG. 2 for integration into a common substrate. Two strings 21, 21' of cascaded gain stages 22 provide a predetermined amount of voltage gain for corresponding inputs V+ and V− of comparator 20. Output from each string 21, 21' couples to corresponding node 35, 35'. Each string 21, 21' has the same number of stages 22, and, typically, no more than one or two stages 22 in each string 21, 21' are necessary. Each gain stage 22 resembles a conventional CMOS inverter, having an input terminal 23, an output terminal 24 and two power supply terminals 25, 26. In an exemplary stage 22, a P-channel FET 30 and an N-channel FET 31 are shown having common gates coupling to the input terminal 23 and common drains coupling to output terminal 24. Although shown here as P- and N- channel FETs, it is understood that the P- and N- channel FETs can be interchanged with a corresponding change in power supply polarity. The source of FET 30 couples to power terminal 25, while the source of FET 31 couples to power terminal 26. The ratio of the sizes of FET 30 to FET 31 will be discussed in more detail below, but it is sufficient to state here that the conventional sizing ratio of FET 30 to FET 31, being approximately two- or three-to-one, will produce a comparator 20 having substantially zero propagation delay skew.

The power terminals 25, 26, of cascaded gain stages 22 couple to corresponding buses 32, 33. Buses 32, 33 are powered by current mirrors 40, 50, respectively. Mirrors 40, 50 are correspondingly powered by $V_{DD}$, the most positive power supply, and $V_{SS}$, the most negative power supply, which is typically at ground or zero volts. The current mirrors 40, 50 serve to isolate the buses 32, 33 from $V_{DD}$ and $V_{SS}$, reducing the susceptibility of the comparator 20 to electrical noise on the power supplies $V_{DD}$, $V_{SS}$.

Current mirror 40 is shown here as a conventional Widlar current mirror with multiple outputs, but it is understood that other types of current mirrors, such as Wilson or compound current mirrors, may be used. FET 42 of mirror 40 couples to a current source 44, setting the amount supplied by mirror 40 and the overall power current consumption of the comparator 20. Typical current supplied by the current source 44 is 100 microamperes to 1 milliamperes depending on output load capacitance on nodes 35, 35' and the desired speed of the comparator 20. FETs 48, 46, 47 of source 40 are sized that the currents flowing out of the FETs' 48, 46, 47 are substantially the same. FET 48 supplies current to bus 32.

Current mirror 50, shown here as a compound current mirror formed by FETs 51, 52, 53, 54, 55, accepts current from the outputs of the current mirror 40 into control current input nodes 56 of the mirror 50. The resulting mirrored current is inputed from bus 33 into serially connected FETs 54, 55 through mirrored current input node 57. Control current output from control current output nodes 58 of the mirror 50 passes through FETs 61, 62 to the most negative power supply, $V_{SS}$. As will be discussed in greater detail below, FETs 61, 62 are operated in the triode, or ohmic, region and have substantially the same size. Likewise, mirrored current output from mirrored current output node 59 of mirror 50 passes through paralleled FETs 65, 66 to $V_{SS}$. Again, as will be discussed in greater detail below, FETs 65, 66 operate in the triode, or ohmic, region and have substantially the same size. As stated above, the current mirror 50 is a compound current mirror for the accurate mirroring of current and is preferably a unity gain current mirror with FETs 51, 53, 54, 55 having substantially the same size. Operation of current mirror 50 is described in detail in U.S. Pat. No. 4,477,782, issued on Oct. 16, 1984 to E. J. Swanson and assigned to the assignee of the present application. However, for purposes here, operation of the current mirror 50 is described briefly herein. FET 52 of the mirror 50 establishes a stable gate voltage for FETs 51 and 54 and is typically one-quarter or less the sizes of FETs 51, 53, 54, 55. Further, FET 52 has a sufficiently high threshold voltage to ensure that FETs 51, 53, and correspondingly, FETs 54, 55, are saturated. FET 51 equalizes the drain-to-source voltages on FET 55 and FET 53, substantially eliminating offset currents in the mirror 50. The serially coupled FETs 54, 55 provide a high impedance current sink at node 57 for current from bus 33. Although a simpler current mirror can be used for current mirror 50, such as a Widlar mirror, the more precise the current is mirrored and the higher the impedance of the mirrored current input node 57 is, the better the accuracy of the comparator 20. Therefore, a suitably adapted Wilson current mirror could be used as mirror 50.

Voltage source 68, coupling to the common gate of FETs 61, 62, is a reference voltage for the average voltage on the output nodes 35, 35' of the strings 21, 21' to achieve, and is referred to here as the output common mode voltage level set. The desirability of adjusting the output common mode voltage strings 21, 21' will be discussed below, but for purposes here, the interface of the strings 21, 21' to a load can be optimized for the characteristics of the load, e.g., digital inverter stages coupled to nodes 35, 35'. Similarly, the paralleled FETs 65, 66, responsive to the voltages on the output nodes 35, 35' of strings 21, 22 are combined so that the paralleled resistances of the FETs 65, 66 correspond to the average of the voltages on the output nodes 35, 35', the output common mode voltage. Put another way, the paralleled resistances of FETs 65, 66 represent the output common mode voltage of the cascaded stages 22 of strings 21, 21'. For the purposes of this discussion, it is assumed that the input voltages to comparator 20 (V+, V−) are substantially the same, the threshold "trip point" of the comparator 20. This corresponds to a zero voltage differential input to inputs V+, V− and is useful for examining the biasing and operation of comparator 20. It is understood however, that the following also applies when the voltage of inputs V+, V− are not substantially the same. It is desired that the output common mode voltage of the strings 21, 21' be substantially the same as the voltage from source 68. To do so, the resistances of FETs 65, 66 and 61, 62 deviate the current gain of the mirror 50 from unity when the output common mode voltage is not substantially the same as the voltage of source 68. As such, the resistances of FETs 61, 62 are substantially the same and are invariant since the voltage of source 68, for purposes here, is invariant. However, the combined resistances of FETs 65, 66 vary inversely proportionally with the voltages on the output nodes 35, 35' of the strings 21, 21', which are dependent on the voltage on the bus 33, hence dependent on the current flowing through the current mirror 50. Since the current through the control current input nodes 56 and through the control current output nodes 58 does not vary, for the comparator 20 to be in equilibrium, there must be substantially equal current flow in the mirrored current and the control current, i.e., unity current gain of the mirror 50. For unity current gain, the combined resistances of the FETs 65, 66 must be substantially the same as the resistances of FETs 61, 62. Hence the average of the voltages on the gates of FETs 65, 66 must be substantially the same as the voltage from voltage source 68, i.e., the output common mode voltage from the cascaded gain stages 22 is substantially the same as the voltage from source 68.

The output nodes 35, 35' couple to corresponding buffers 45, operating as a conventional CMOS digital inverter. Although only one buffer 45 is shown corresponding to each string 21, 21', it is understood that multiple, cascaded buffers 45 can be used. Output terminals 24 of buffers 45 are the outputs for the comparator 20, OUTPUT and OUTPUT'. Buffers 45 are similar in structure to gain stage 22 but with as small a device as possible to reduce capacitive loading of the strings 21, 21'. Power supply terminals 25, 26 of buffers 45 couple to power sources $V_{DD}$ and $V_{SS}$ instead of buses 32, 33. As will be discussed in more detail below, the sizing of the FETs in each buffer 45, corresponding to FETs 30, 31 in stage 22, is typically two- or three-to-one, respectively, for minimum propagation delay skew and a threshold voltage of substantially one-half the voltage difference between $V_{DD}$ and $V_{SS}$.

Figure 3:
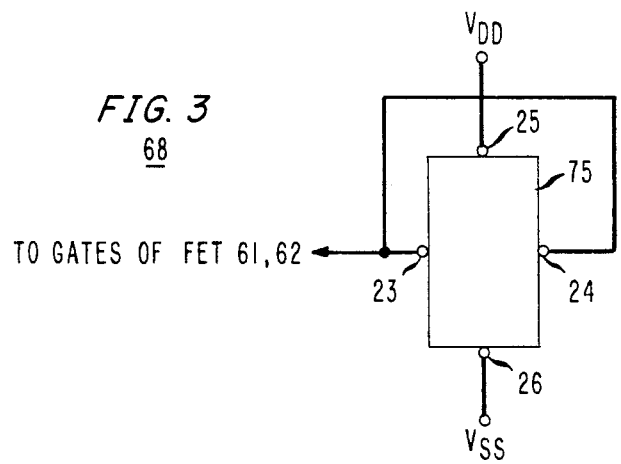
FIGS. 3, 4 and 5 are improvements to the analog comparator of FIG. 2.

The ability to adjust the output common mode voltage of strings 21, 21' can be used advantageously by recognizing that optimal operation of the comparator 20 requires that, when the voltage on V+ is approximately the same as the voltage on V−, the voltage on nodes 35, 35' should be approximately the threshold voltages of buffers 45. The threshold voltage of the buffer 45 is the input voltage at which the output of the buffer 45 transitions from $V_{DD}$ to $V_{SS}$, and vice versa. This minimizes propagation delay skew through comparator 20. Therefore, the output common mode voltage of strings 21, 21' should be approximately the threshold voltage of buffers 45. This is accomplished by having the voltage of voltage source 68 be substantially that of the threshold voltage of buffers 45. Referring temporarily to FIG. 3, source 68 (FIG. 2) is shown having a buffer 75, substantially similar to the buffers 45 in FIG. 2 and preferably integrated on the same substrate therewith, with input terminal 23 coupling to output terminal 24 and with power terminals 25, 26 coupling to corresponding power sources $V_{DD}$ and $V_{SS}$. Having buffer 75 operating with input 23 coupled to output 24, the voltage on input terminal 23 is substantially the threshold voltage of the buffer 75. Hence the voltage of voltage source 68 (FIG. 2) is substantially the threshold voltage of buffers 45 (FIG. 2). By having buffer 75 on the same chip as buffers 45 (FIG. 2), variations in threshold voltage of buffers 45 due to temperature and processing variations will be compensated for by variations in threshold voltage of buffer 75.

Figure 4:
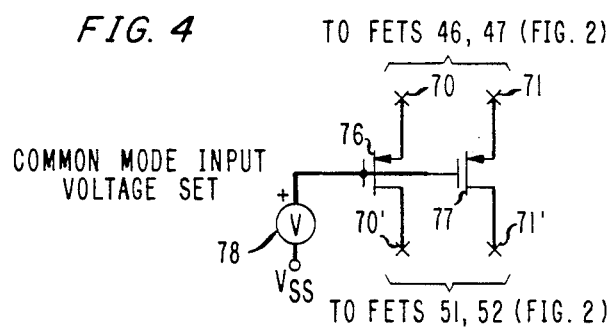
Figure 5:
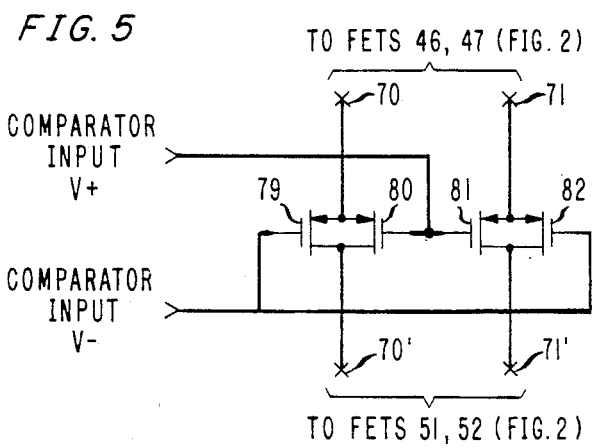

Returning to FIG. 2, it is recognized that due to the finite output resistances of FETs, the output common mode voltage of strings 21, 21' will not precisely match that of voltage source 68 when inputs V+ and V− are substantially the same, i.e., when the input voltages are at the comparator threshold. As noted above, when the V+ and V− inputs are substantially the same, by virtue of the disclosed invention, the output common mode voltage of nodes 35, 35' should be substantially equal to the voltage of source 68. However, the voltage on bus 32 is different from the voltage on the drains of FETs 46, 47, hence the voltage across FET 48 is different from the voltage across FETs 46, 47. This results in differing current flow through FETs 46, 47 from that through FET 48 due to the voltage across FETs 46, 47 being different from the voltage across FET 48 with the inherent output resistances of the FETs 46, 47, 48. Furthermore, the voltage on bus 32 varies with the average voltage of the inputs V+, V−, referred to here as the input common mode voltage. To compensate for the different current flow, the gain of the current mirror must decrease. This is accomplished by the output common mode voltage changing from the desired voltage until equilibrium is reached. To equalize the currents through FETs 46, 47, 48, and thus make the output common mode voltage on nodes 35, 35' more closely equal to the voltage of voltage source 68, at breakpoints 70, 70' and 71, 71', the circuit in FIG. 4 is substituted. In FIG. 4, two FETs 76, 77 have common gates coupling to a voltage source 78, referred to here as the input common mode voltage set. The FETs 76, 77, are each sized to be substantially 2N times the size of FET 30 in a gain stage 22 (FIG. 2), N being the number of gain stages 22 in a string 21, 21' and disposed on the same substrate as FET 30. This assures that the voltage across FETs 46, 47 is substantially the same as the voltage across FET 48 (FIG. 2) when the input common mode voltage of inputs V+, V− of comparator 20 (FIG. 2) is known. However, if the input common mode voltage is not known, then the circuit in FIG. 5 can be used to derive the input common mode voltage from inputs V+, V− by having FETs 79, 80, 81, 82 in the arrangement shown disposed between breakpoints 70, 70' and 71, 71' in FIG. 2 and preferably integrated onto a substrate common with the circuitry in FIG. 2. The sizes of FETs 79, 80, 81, 82 are each N times the size of FET 30 (FIG. 2), N being the number of stages 22 in a string 21, 21'. This will assure that the voltage across FETs 46, 47 is substantially the same as the voltage across FET 48 with varying input common mode voltage, thus ensuring that the output common mode voltage on nodes 35, 35' remains substantially the same as the voltage from voltage source 68.

As stated above, the sizing of the FETs 30, 31 in stages 22 and, correspondingly, in buffers 45 and 75 (FIG. 3), are an exemplary two- or three-to-one to yield a threshold voltage approximately one-half the voltage between power supply terminals 25, 26 and for minimum propagation delay skew. However, it is understood that the sizing of the FETs 30, 31 can be one-to-one for minimum propagation delay through stages 22, buffers 45, or any combination thereof.

Having described the preferred embodiment of this invention, it will now be apparent to one of skill in the art that other embodiments incorporating the concepts disclosed herein may be used. It is felt, therefore, that this invention should not be limited to the disclosed embodiment, but rather should be limited only by the spirit and scope of the appended claims.

We claim:

1. An analog comparator formed on an integrated circuit for comparing a first voltage input to a second voltage input, characterized by:
   a first string of at least one cascaded gain stage, each stage having an input, an output and first and second power terminals, the corresponding power terminals coupling to first and second buses, the input of the first of the cascaded gain stages coupling to the first voltage input of the comparator;

a second string of at least one cascaded gain stage, each stage having an input, an output and first and second power terminals, the corresponding power terminals coupling to the first and second buses, the input of the first of the cascaded gain stages coupling to the second voltage input of the comparator;

a first current source coupling to the first bus; and, a second current source coupling to the second bus and providing substantially the same current as the first current source.

2. The analog comparator recited in claim 1, further characterized by:

at least one digital inverter responsive to at least one of the outputs of the first and second strings of cascaded gain stages.

3. The analog comparator recited in claim 2, wherein each of the cascaded gain stage comprises a first transistor of a first polarity and a second transistor of a second polarity, each transistor having two output terminals and an input terminal, the input terminals of the two transistors coupling together to form the input to the gain stage, two corresponding output terminals from the two transistors coupling together to form the output of the gain stage, and the remaining output terminals of the two transistors forming the corresponding first and second power terminals of the gain stage.

4. The analog comparator recited in claim 3, wherein the digital inverter is a conventional CMOS digital inverter.

5. The analog comparator recited in claim 4, wherein the second voltage input couples to a reference voltage.

6. The analog comparator recited in claim 5, wherein transistors of the first conductivity type are N-channel MOSFETs and transistors of the second conductivity type are P-channel MOSFETs.

7. An analog comparator formed in an integrated circuit for comparing a first voltage input to a second voltage input characterized by:

a first string of at least one cascaded gain stage, each stage having an input, an output and first and second power terminals, the corresponding power terminals coupling to first and second buses, the input of the first of the cascaded gain stages coupling to the first voltage input of the comparator;

a second string of at least one cascaded gain stage, each stage having an input, an output and first and second power terminals, the corresponding power terminals coupling to the first and second buses, the input of the first of the cascaded gain stages coupling to the second voltage input of the comparator;

a current source having a first and second outputs, the first output coupling to the first bus;

a first current mirror having a first control current input, a first control current output, a mirrored current input and a mirrored current output, the first control current input coupling to the second output of the current source and the mirrored current input coupling to the second bus;

a first node having a first predetermined voltage thereon;

a first transistor network having first and second output terminals and an input terminal, the first output terminal coupling to the first control current output of the first current mirror, the second output terminal coupling to a first power source and the input terminal coupling to the first node;

a second transistor network having two output terminals and two input terminals, the corresponding output terminals coupling between the mirrored current output of the first current mirror and the first power source, each input terminal coupling to the corresponding output of the first and second string of cascaded gain stages; and, such that the average of the voltages on the outputs of the first and second strings of cascaded gain stages is approximately that of the first predetermined voltage on the first node.

8. The analog comparator recited in claim 7, wherein the first and second transistor networks operate as variable resistors responsive to voltages applied to the corresponding input terminals.

9. The analog comparator recited in claim 8, the second transistor network comprising first and second transistors of a first polarity having two common output terminals and each having an input terminal, corresponding common output terminals of the transistors coupling to corresponding output terminals of the second transistor network and corresponding input terminals of the transistors coupling to the corresponding input terminals of the second transistor network; wherein the sizes of the first and second transistors are substantially the same.

10. The analog comparator recited in claim 9, the current source comprising a second current mirror having a first and a second mirrored current outputs and a control current output, the control current output coupling to a predetermined current source, the first mirrored current output coupling to the first output of the current source and the second mirrored current output coupling to the second output of the current source; wherein the current from the first and second mirrored current outputs are substantially the same.

11. The analog comparator recited in claim 10, further characterized by the second current mirror having a third mirrored current output for supplying current substantially the same as the first and second mirrored current output; the first transistor network having a third output terminal; and the first current mirror being a compound current mirror having a second control current input and a second control current output, the second control current input coupling to the third mirrored current output of the second current mirror and the second control current output coupling to the third output terminal of the first transistor network.

12. The analog comparator recited in claim 11, the first transistor network comprising: a pair of transistors of the first polarity having a common output terminal, a common input terminal and first and second output terminals, the first and second output terminals, the common output terminal and the common input terminal coupling to corresponding first, third and second output terminals and input terminal of the first transistor network, wherein the sizes of the pair of transistors are substantially the same size and are each substantially twice the size of the first and second transistors of the first transistor network.

13. The analog comparator recited in claim 12, further characterized by:

at least one digital inverter responsive to at least one of the outputs of the first and second plurality of cascaded gain stages.

14. The analog comparator recited in claim 13, wherein each of the cascaded gain stages comprises a first transistor of the first polarity and a second transistor of a second polarity, each transistor having two output terminals and an input terminal, the input terminals of the two transistors coupling together to form the input to the gain stage, two corresponding output terminals from the two transistors coupling together to form the output of the gain stage, and the remaining output terminals of the two transistors forming the corresponding first and second power terminals of the gain stage.

15. The analog comparator recited in claim 14, further characterized by a third transistor network, disposed between the second and third mirrored current outputs of the second current mirror and the first and second control current inputs of the first current mirror, responsive to a second predetermined voltage source.

16. The analog comparator recited in claim 15, the third transistor network characterized by a pair of transistors of the second polarity having a common input terminal coupled to the second predetermined voltage source and two output terminals for each transistor, the corresponding output terminals coupling between the second and third mirrored current outputs of the second current mirror and the first and second control current inputs of the first current mirror.

17. The analog comparator recited in claim 15, wherein the second predetermined voltage is substantially the same as the average voltage on the first and second voltage inputs to the comparator.

18. The analog comparator recited in claim 14, further characterized by a third transistor network, disposed between the second and third mirrored current outputs of the second current mirror and the first and second control current inputs of the first current mirror, responsive to the first and second input voltages to the comparator.

19. The analog comparator recited in claim 18, the third transistor network further characterized by two pairs of transistors of the second polarity, each pair having two common output terminals and two input terminals, common output terminals coupling to the corresponding second and third mirrored current outputs of the second current mirror and to the corresponding first and second control current inputs of the first current mirror, a first one of the input terminals of the pairs of transistors coupling to the first input voltage of the comparator and a second one of the input terminals of the pairs of transistors coupling to the second input voltage of the comparator.

20. The analog comparator recited in claim 14, wherein the first predetermined voltage is substantially the threshold voltage of the digital inverter.

21. The analog comparator recited in claim 20, wherein the digital inverter is a conventional CMOS digital inverter.

22. The analog comparator recited in claim 21, wherein the first predetermined voltage is generated by a CMOS digital inverter having the input and output thereof directly connected together.

23. The analog comparator recited in claim 22, wherein the second voltage input couples to a reference voltage.

24. The analog comparator recited in claim 23, wherein transistors of the first conductivity type are N-channel MOSFETs and transistors of the second conductivity type are P-channel MOSFETs.

25. A method for comparing first and second input voltages, comprising the steps of:
amplifying the first voltage with cascaded gain stages powered by first and second buses; and,
amplifying the second voltage with cascaded gain stages powered by the first and second buses;
wherein the buses are powered by current sources providing substantially the same current and the amplified first and second voltages are complementary outputs indicating whether second voltage is greater than or less than the first voltage and wherein each output of the cascaded gain stages corresponds to the difference between the first and second output voltages.

26. The method for comparing first and second voltages of claim 25, wherein at least one of the current sources includes a current mirror, the current mirror being responsive to the remaining current source and is adapted to vary the magnification factor of the current mirror, further comprising the steps of:
increasing the magnification factor of the current mirror in response to a first predetermined voltage source;
sensing the average voltage of the amplified first and second voltages; and,
decreasing the magnification factor of the current mirror in response to the sensed average voltage;
such that the magnification factor settles to a value necessary for the average voltage of the amplified first and second voltages to be substantially the same as the first predetermined voltage.

27. The method for comparing first and second voltages of claim 26, further comprising the steps of:
buffering at least one of the amplified first and second voltages with a first digital inverter having a predetermined threshold voltage;
generating the first predetermined voltage from a second digital inverter having substantially the same threshold voltage as the first digital inverter by coupling the input of the second digital inverter to the output thereof.

* * * * *